US012772905B2

(12) United States Patent
Chen et al.

(10) Patent No.: US 12,772,905 B2
(45) Date of Patent: Oct. 20, 2026

(54) WAFER-LEVEL PACKAGING STRUCTURE AND METHOD FOR PREPARING SAME

(71) Applicant: SJ Semiconductor (Jiangyin) Corporation, Jiangyin (CN)

(72) Inventors: Yenheng Chen, Jiangyin (CN); Chengchung Lin, Jiangyin (CN)

(73) Assignee: SJ Semiconductor(Jiangyin) Corporation, JiangSu Province (CN)

( * ) Notice: Subject to any disclaimer, the term of this patent is extended or adjusted under 35 U.S.C. 154(b) by 512 days.

(21) Appl. No.: 18/344,218

(22) Filed: Jun. 29, 2023

(65) Prior Publication Data

US 2024/0055416 A1 Feb. 15, 2024

(30) Foreign Application Priority Data

Aug. 10, 2022 (CN) ......................... 202210955805.6

(51) Int. Cl.

| | |
|---|---|
| ***H01L 25/16*** | (2023.01) |
| ***H01L 23/00*** | (2006.01) |
| ***H01L 23/538*** | (2006.01) |
| ***H10D 1/20*** | (2025.01) |
| ***H10D 1/68*** | (2025.01) |
| ***H10W 70/05*** | (2026.01) |
| ***H10W 70/60*** | (2026.01) |
| ***H10W 70/63*** | (2026.01) |
| ***H10W 70/685*** | (2026.01) |
| ***H10W 90/00*** | (2026.01) |
| *H10W 72/00* | (2026.01) |

(52) U.S. Cl.

CPC .............. *H10W 90/00* (2026.01); *H10D 1/20* (2025.01); *H10D 1/68* (2025.01); *H10W 70/05* (2026.01); *H10W 70/095* (2026.01); *H10W 70/611* (2026.01); *H10W 70/635* (2026.01); *H10W 70/685* (2026.01); *H10W 90/701* (2026.01); *H10W 72/07236* (2026.01); *H10W 90/724* (2026.01)

(58) Field of Classification Search

CPC .. H10D 1/20; H10D 1/68; H10D 1/47; H10D 88/00; H10D 88/01; H10D 88/101; H10D 99/00; H10D 89/10; H01L 2924/19011; H01L 21/486; H01L 21/4857; H01L 23/5384; H01L 23/5383; H01L 23/49822; H01L 23/5381; H01L 25/0655; H01L 25/16; H01L 2224/02379

See application file for complete search history.

(56) References Cited

U.S. PATENT DOCUMENTS

| | | | | |
|---|---|---|---|---|
| 10,433,425 | B1 * | 10/2019 | Liu | H05K 1/185 |
| 2021/0183794 | A1 * | 6/2021 | Tang | H01L 25/16 |
| 2023/0137691 | A1 * | 5/2023 | Lai | H01L 23/145 257/701 |

* cited by examiner

*Primary Examiner* — Lawrence C Tynes, Jr.
(74) *Attorney, Agent, or Firm* — IPRTOP LLC

(57) ABSTRACT

A wafer-level packaging structure and a method for preparing the same are provided, the wafer-level packaging structure includes at least a molding layer and a 3D IPD structure fabricated in the molding layer. The wafer-level packaging structure of the present disclosure can integrate various electronic chips and components such as millimeter wave antenna/capacitor/inductor/electric crystal/GPU/PMU/DDR/flash memory/filter, etc., with higher flexibility and wider compatibility, thus reducing package size and package cost.

13 Claims, 5 Drawing Sheets

WAFER-LEVEL PACKAGING STRUCTURE AND METHOD FOR PREPARING SAME

CROSS REFERENCE TO RELATED APPLICATION

The present application claims the benefit of priority to Chinese Patent Application No. CN 202210955805.6, entitled "WAFER-LEVEL PACKAGING STRUCTURE AND METHOD FOR PREPARING SAME", filed with CNIPA on Aug. 10, 2022, the disclosure of which is incorporated herein by reference in its entirety for all purposes.

FIELD OF THE INVENTION

The present disclosure generally relates to the field of semiconductor packaging technology, and in particular, relates to a wafer-level packaging structure and a method for preparing the same.

BACKGROUND OF THE INVENTION

As electronic products such as computers, tablets, mobile phones, car controls, household appliance controls, and Internet of things (IoT) objects have become smaller, faster, more energy-efficient and higher-performing, there is an increasing demand for the miniaturization and integration of chips on these objects. Packaging more functional modules onto a single die has become an important trend in semiconductor packaging.

To achieve product integration, active devices like switches, low noise amplifiers, power amplifiers, basebands, and application processors are integrated onto a single die. Additionally, more wafer-level packaging requires the introduction of RF Integrated Passive Devices (IPDs) like filters to reduce the size of RF modules.

Most related technologies use planar IPDs. Since these IPDs are formed on a 2D plane parallel to the silicon substrate, they can't meet the integration requirements of RF packaging structures or packaging performance, especially at high frequencies.

In related technology, independent IPDs can also be fixed to the substrate using flip-chip bonding or wire bonding. Using these methods to introduce IPDs requires additional packaging space and may cause deterioration of IPD performance due to the introduction of solder balls or wire bonding.

Therefore, integrating 3D IPDs into wafer-level packaging structures is a challenge that needs to be addressed by technical professionals in this field.

SUMMARY OF THE INVENTION

The present disclosure provides a wafer-level packaging structure, including a molding layer, and a 3D IPD structure fabricated in the molding layer, wherein the molding layer includes a first surface and a second surface opposite to the first surface.

The present disclosure further provides a method for preparing a wafer-level packaging structure, including: preparing a molding layer; and forming a 3D IPD structure inside the molding layer.

The wafer-level packaging structure of the present disclosure can integrate various electronic chips and components such as millimeter wave antenna/capacitor/inductor/electric crystal/GPU/PMU/DDR/flash memory/filter, etc., with higher flexibility and wider compatibility, thus reducing package size and package cost.

REFERENCE NUMERALS

Figure 1:
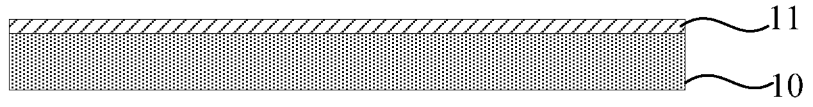
FIGS. 1 to 7 are schematic diagrams showing intermediate structures obtained after various steps of a method for preparing a 3D IPD structure in a wafer-level packaging structure according to the present disclosure.

1 Molding layer
2 3D IPD structure
21 3D inductive IPD structure
211 First metal solder pads
212 Metal pillars
213 Second metal solder pads
22 3D capacitive IPD structure
221 Metal layer
3 First rewiring layer
31 First dielectric layer
32 First wiring metal layer
4 Second rewiring layer
41 Second dielectric layer
42 Second wiring metal layer
5 Metal connection pillars
6 Chips
7, 8 Solder balls
9 RF ASIC chip
10 Substrate
11 Release layer

DETAILED DESCRIPTION

The embodiments of the present disclosure will be described below. Those skilled can easily understand disclosure advantages and effects of the present disclosure according to contents disclosed by the specification. The present disclosure can also be implemented or applied through other different exemplary embodiments. Various modifications or changes can also be made to all details in the specification based on different points of view and applications without departing from the spirit of the present disclosure.

Refer to FIGS. 1-9. It should be noted that the drawings provided in this disclosure only illustrate the basic concept of the present disclosure in a schematic way, so the drawings only show the components closely related to the present disclosure. The drawings are not necessarily drawn according to the number, shape, and size of the components in actual implementation; during the actual implementation, the type, quantity, and proportion of each component can be changed as needed, and the components' layout may also be more complicated.

Figure 7:
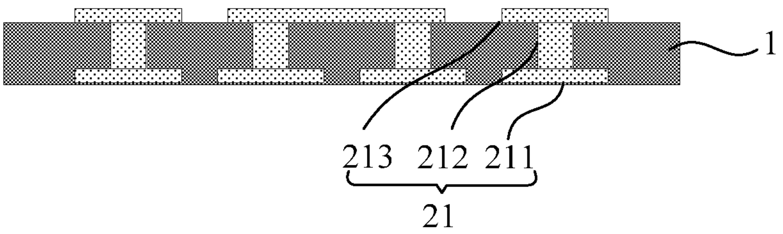
Figure 8:
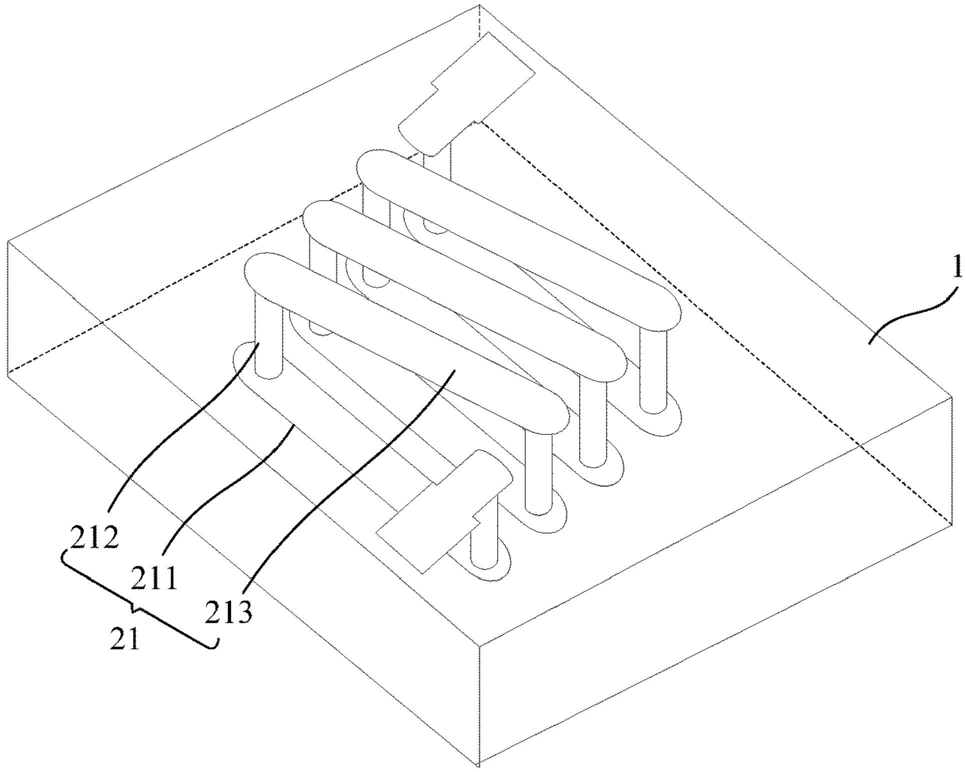
FIGS. 8 and 9 are three-dimensional schematic diagrams of two 3D IPD structures.
Figure 9:
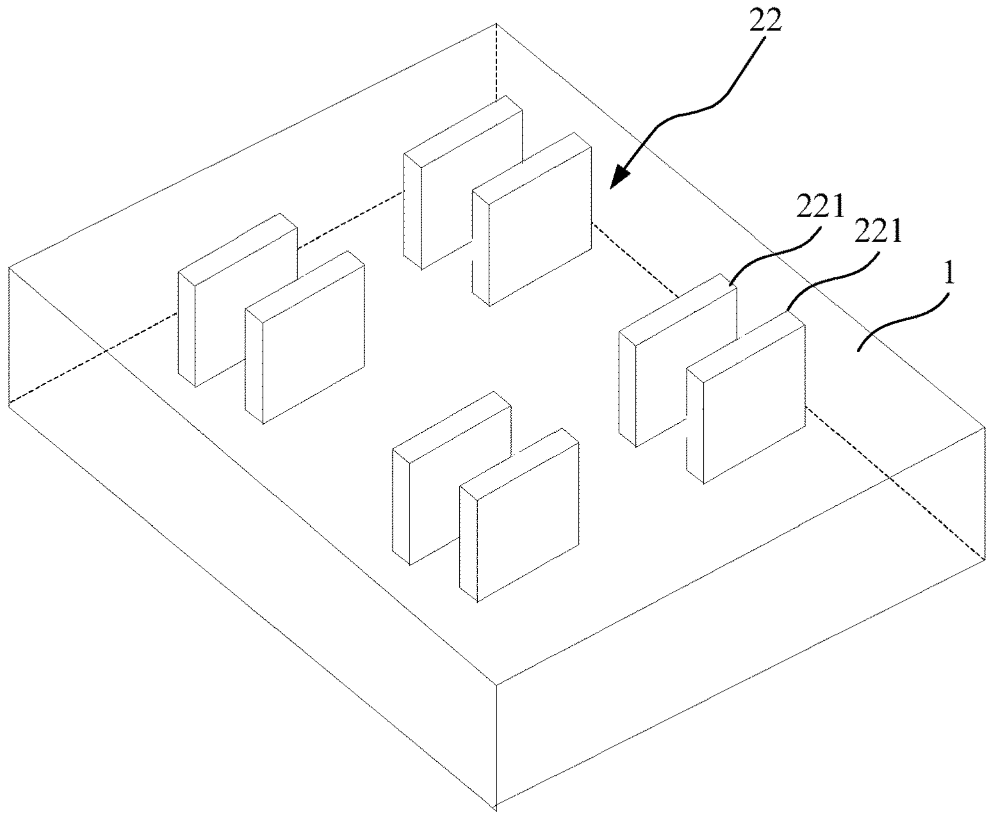

The present disclosure provides a wafer-level packaging structure, as shown in FIGS. 7, 8 and 9, and the wafer-level packaging structure includes a molding layer 1 and a 3D IPD structure fabricated in the molding layer 1.

As an example, a material of the molding layer 1 includes one or more of epoxy-based resin, liquid thermosetting epoxy resin, and plastic molding compound, and techniques of forming the molding layer 1 include one of compression molding, transfer molding, liquid seal potting molding, vacuum lamination, and spin coating. A thickness of the molding layer 1 ranges from 10 um to 200 um, for example, it can be 30 um, 50 um, 80 um, 100 um, 150 um, 180 um, etc.

As an example, the 3D IPD structure includes one or more of a 3D inductive IPD structure 21, a 3D capacitive IPD structure 22, and a 3D resistive IPD structure.

In one example, as shown in FIGS. 7 and 8, the molding layer 1 includes a first surface and a second surface opposite to the first surface, and the 3D inductive IPD structure 21 includes first metal solder pads 211, metal pillars 212, and second metal solder pads 213. Specifically, as an example, the first surface is the bottom surface of the molding layer 1, and the second surface is the top surface of the molding layer 1. The first metal solder pads 211 are formed inside the molding layer 1 and extend inwards from the first surface of the molding layer 1; the metal pillars 212 are formed inside the molding layer 1 and located over ends of the first metal solder pads 211; the second metal solder pads 213 are formed on the molding layer 1 and extend outwards from the second surface of the molding layer 1; the second metal solder pads 213 connect the metal pillars 212 in series, with each of the second metal solder pads 213 connecting two of the metal pillars 212 that are respectively located over two adjacent first metal solder pads 211, forming a 3D inductive IPD structure 21. FIG. 7 is a cross-sectional view and FIG. 8 is a three-dimensional view of the structure.

As an example, a material of the first metal solder pads 211 includes, but is not limited to, copper. Techniques of forming the first metal solder pads 211 include one of physical vapor deposition, chemical vapor deposition, sputtering, electroplating, and chemical plating. As an example, the first metal solder pads 211 are arranged parallel to each other.

As an example, the metal pillar 212 includes one of a copper pillar and a titanium pillar, and the method for forming the metal pillar 212 includes one of physical vapor deposition (PVD), chemical vapor deposition (CVD), sputtering, electroplating, and chemical plating.

As an example, a material of the second metal solder pads 213 includes, but is not limited to, copper. Techniques of forming the second metal solder pads 213 include one of physical vapor deposition, chemical vapor deposition, sputtering, electroplating, and chemical plating. As an example, the second metal solder pads 213 are arranged parallel to each other.

As an example, as shown in FIG. 9, the 3D capacitive IPD structure 22 includes at least one pair of metal layers 221 formed in the molding layer 1 parallel to each other, wherein each pair of the at least one pair of metal layers 221 is in a plane perpendicular to the first and second surfaces the molding layer 1.

Although only a 3D inductive IPD structure 21 and a 3D capacitive IPD structure 22 are described, in other embodiments there may be other 3D IPD structures in the packaging structure.

Figure 10:
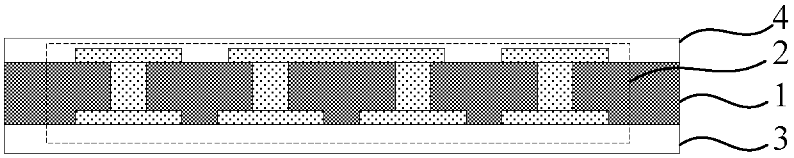
FIG. 10 and FIG. 12 are schematic diagrams showing a first rewiring layer and a second rewiring layer of a wafer-level packaging structure according to the present disclosure.
Figure 12:
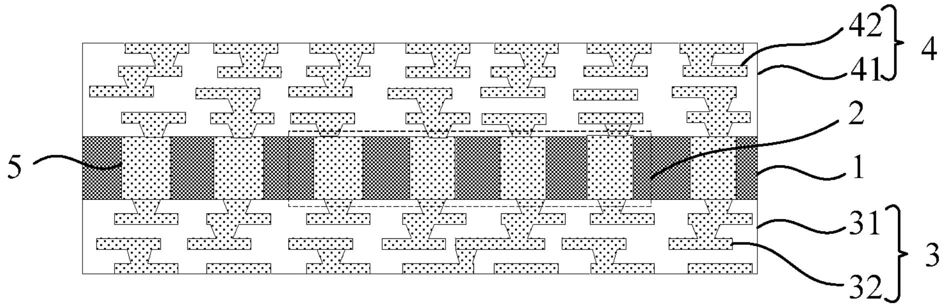

As an example, as shown in FIG. 10 and FIG. 12, the wafer-level packaging structure further includes a first rewiring layer 3 formed on the first surface of the molding layer 1 and a second rewiring layer 4 formed on the second surface of the molding layer 1, wherein the first rewiring layer 3 includes a first dielectric layer 31 and a first wiring metal layer 32 formed in the first dielectric layer 31, wherein the second rewiring layer 4 includes a second dielectric layer 41 and a second wiring metal layer 42 formed in the second dielectric layer 41 and connected to the 3D IPD structure 2.

The first wiring metal layer 32 and the second wiring metal layer 42 are not shown in FIG. 10.

As an example, materials of the first dielectric layer 31 and the second dielectric layer 41 include at least one of epoxy resin, silicone, polyimide, polybenzoxazoles, benzocyclobutene, silicon oxide, phosphor silica glass, fluorine containing glass, and other suitable materials.

As an example, materials of the first wiring metal layer 32 and the second wiring metal layer 42 include at least one of copper, aluminum, and titanium. Techniques of forming the first wiring metal layer 32 and the second wiring metal layer 42 include one of physical vapor deposition, chemical vapor deposition, sputtering, electroplating, and chemical plating, The first wiring metal layer 32 and the second wiring metal layer 42 are single-layer or multiple-layer structures.

The wafer-level packaging structure may also include other structural layers to form different types of wafer-level packaging structures.

Figure 11:
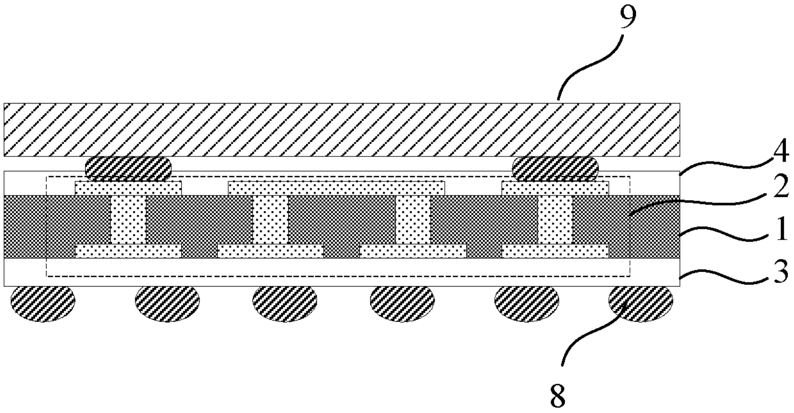
FIG. 11 is a schematic structural diagram of an RF ASIC wafer-level packaging structure with an integrated 3D IPD structure according to the present disclosure.

As an example, as shown in FIG. 11, the wafer-level packaging structure is an RF ASIC wafer-level packaging structure, and further includes an RF ASIC chip 9 and solder balls 8. The RF ASIC chip 9 is formed on a surface of the second rewiring layer 4 and is connected to the second wiring metal layer (not shown); the solder balls 8 are formed on a surface of the first rewiring layer 3 and are connected to the first wiring metal layer (not shown).

Figure 13:
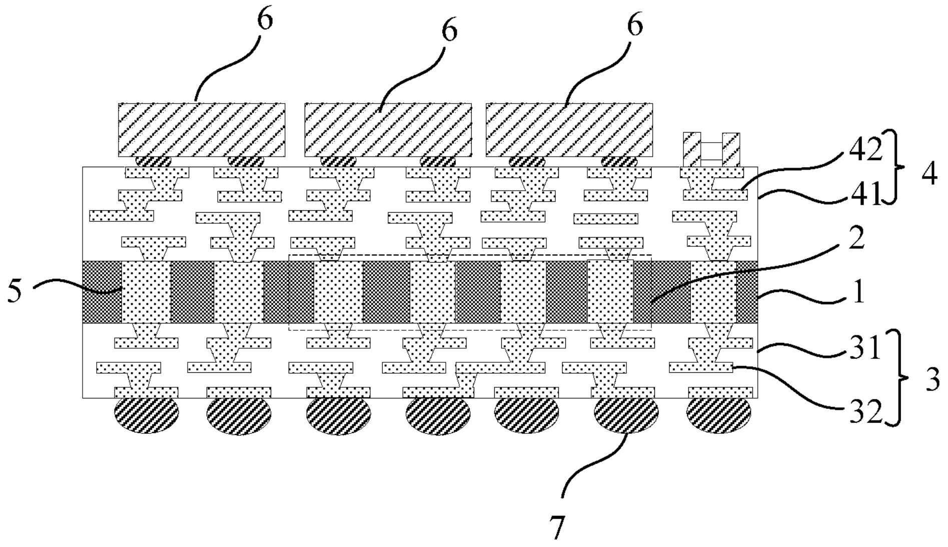
FIG. 13 is a schematic structural diagram of a fan-out wafer-level packaging structure with an integrated 3D IPD structure according to the present disclosure.

As another example, as shown in FIG. 13, the wafer-level packaging structure is a fan-out wafer-level packaging structure, and further includes metal connection pillars 5, chips 6, and solder balls 7. The metal connection pillars 5 are formed in the molding layer 1 and are connected to the first wiring metal layer 32 and the second wiring metal layer 42; the chips 6 are soldered to the second rewiring layer 4 and are connected to the second wiring metal layer 42; the solder balls 7 are formed on a surface of the first rewiring layer 3 and are connected to the first wiring metal layer 32.

Material of the solder balls 7, 8 include, but are not limited to, copper or nickel. The first wiring metal layer 32 may have solder balls 7, 8 directly formed on its surface, or may have metal pillars (not shown) formed thereon first and then have solder balls 7, 8 formed on the metal pillars.

It should be noted that the wafer-level packaging structure of the present disclosure can serve as an RF ASIC wafer-level packaging structure or a fan-out wafer-level packaging structure, and it can also serve as any other packaging structure that requires the integration of a 3D IPD structure.

The present disclosure also provides a method for preparing a wafer-level packaging structure, using which the above-mentioned wafer-level packaging structure can be obtained. The method includes: first preparing a molding layer 1; and forming a 3D IPD structure 2 in the molding layer.

As an example, the 3D IPD structure includes one or more of a 3D inductive IPD structure 21, a 3D capacitive IPD structure 22, and a 3D resistive IPD structure. Depending on the specific packaging type, the 3D IPD structure 2 can also be other suitable passive devices.

As an example, the 3D IPD structure 2 is a 3D inductive IPD structure 21, and forming the 3D inductive IPD structure 21 in the molding layer 1 may include the steps described below.

Figure 2:
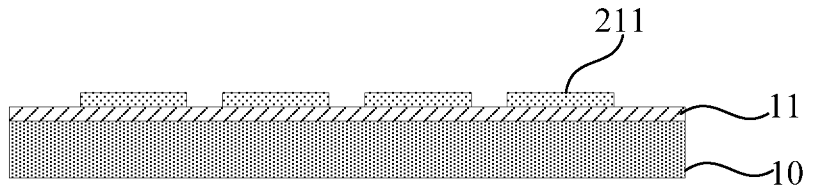

First, providing a substrate 10 having a release layer 11 as shown in FIG. 1, and then forming first metal solder pads 211 on a surface of the release layer 11 as shown in FIG. 2.

As an example, the substrate 10 includes one of a glass substrate, a metal substrate, a semiconductor substrate, a polymer substrate, and a ceramic substrate. In one example, the substrate 10 is a semiconductor substrate, such as a silicon wafer. The shape of the substrate 10 may be round, square or any other desired shapes. In one example, the substrate 10 is used to prevent structural layers above it from cracking, warping, breaking, etc. during subsequent manufacturing processes.

The release layer 11 is used to subsequently separate the substrate 10 from the molding layer 1 and the first metal solder pads 211. The release layer 11 includes one of a tape layer and a polymer layer, which is applied to the substrate 10 by spin coating and then cured by laser curing, ultraviolet (UV) curing, or thermal curing.

As an example, a material of the first metal solder pads 211 includes, but is not limited to, copper. Techniques of forming the first metal solder pads 211 include one of physical vapor deposition, chemical vapor deposition, sputtering, electroplating, and chemical plating. As an example, the first metal solder pads 211 are arranged parallel to each other.

Figure 3:
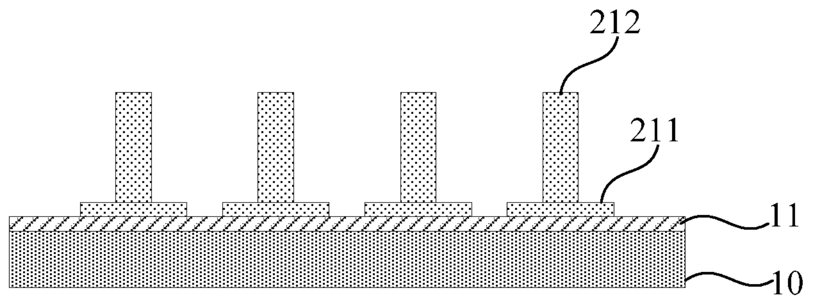

Then, as shown in FIG. 3, metal pillars 212 are formed over ends of the first metal solder pads 211. Specifically, each of the first metal solder pads includes two distal ends, and a metal pillar is formed over each of the distal ends.

As an example, the metal pillar 212 includes one of a copper pillar and a titanium pillar, and the method for forming the metal pillar 212 includes one of the processes such as physical vapor deposition (PVD), chemical vapor deposition (CVD), sputtering, electroplating, and chemical plating.

Figure 4:
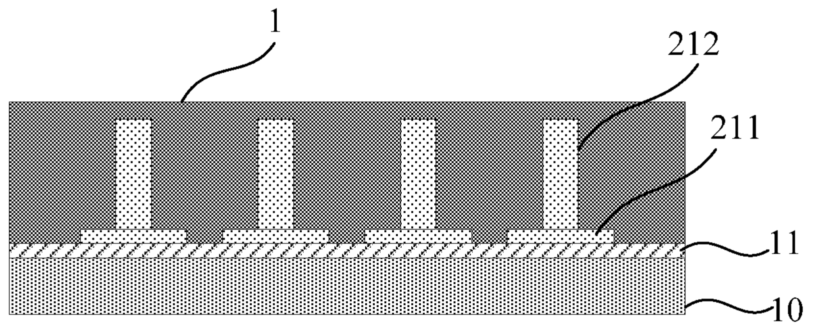
Figure 5:
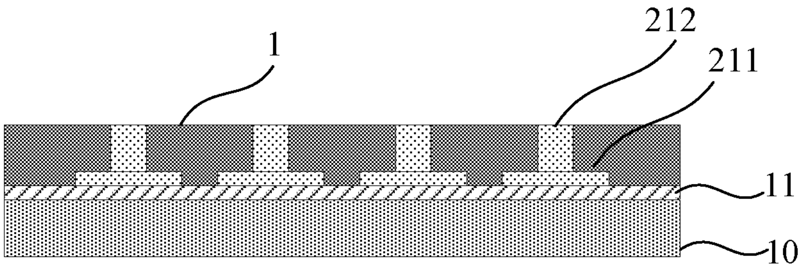

Next, a molding layer 1 covering the metal pillars 212 and the first metal solder pads 211 is formed over the release layer 11, as shown in FIG. 4; then the molding layer 1 and the metal pillar 212 are thinned, as shown in FIG. 5.

As an example, a material of the molding layer 1 includes one or more of epoxy-based resin, liquid thermosetting epoxy resin, and plastic molding compound, and techniques of forming the molding layer 1 include one of compression molding, transfer molding, liquid seal potting molding, vacuum lamination, and spin coating. The molding layer 1 as shown in FIG. 4 undergoes thinning and grinding processes to expose the top surfaces of the metal pillars 212 to obtain a structure as shown in FIG. 5.

Figure 6:
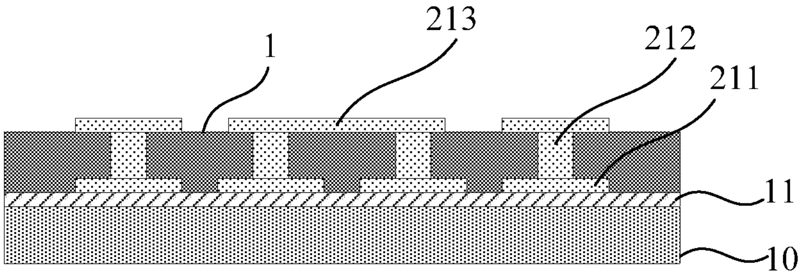

Next, second metal solder pads 213 are formed over the molding layer 1 as shown in FIG. 6; the second metal solder pads 213 connect the metal pillars 212 in series, with each of the second metal solder pads 213 connecting two of the metal pillars 212 that are respectively placed over two adjacent first metal solder pads 211.

As an example, a material of the second metal solder pads 213 includes, but is not limited to, copper. Techniques of forming the second metal solder pads 213 include one of physical vapor deposition, chemical vapor deposition, sputtering, electroplating, and chemical plating. As an example, the second metal solder pads 213 are arranged parallel to each other.

Finally, as shown in FIG. 7, the substrate 10 is removed along with the release layer 11, thereby forming a 3D inductive IPD structure 21.

Refer to FIG. 8, which is a three-dimensional view of the structure shown in FIG. 7. It can be seen that the 3D inductive IPD structure 21 is formed inside the molding layer 1.

As another example, the 3D IPD structure 2 is a 3D capacitive IPD structure 22, and forming the 3D capacitive IPD structure 22 in the molding layer 1 may include the steps described below.

First, providing a substrate having a release layer, forming a molding layer on a surface of the release layer.

Next, etching the molding layer to form at least one pair of parallel openings exposing the release layer;

Then, filling the openings with metal materials to form at least one pair of metal layers 221 parallel to each other, wherein the at least one pair of metal layers 221 are spaced apart and parallel to each other, wherein said pair of metal layers 221 are perpendicular to one of the first and second surfaces of the molding layer;

Finally, removing the release layer to remove the substrate, thereby forming the 3D capacitive IPD structure 22, as shown in FIG. 9, which is a three-dimensional view of the 3D capacitive IPD structure 22.

Although only one method for prepare a 3D inductive IPD structure 21 or a 3D capacitive IPD structure 22 is described, in other examples there may be other methods for preparing corresponding 3D IPD structures.

As an example, as shown in FIG. 10 and FIG. 12, the method for preparing a wafer-level packaging structure may further include: forming a first rewiring layer 3 on a first surface of the molding layer 1 and a second rewiring layer 4 on a second surface of the molding layer 1, wherein the first rewiring layer 3 includes a first dielectric layer 31 and a first wiring metal layer 32 formed in the first dielectric layer 31, wherein the second rewiring layer 4 includes a second dielectric layer 41 and a second wiring metal layer 42 formed in the second dielectric layer 41 and connected to the 3D IPD structure 2.

The first wiring metal layer 32 and the second wiring metal layer 42 are not shown in FIG. 10.

As an example, materials of the first dielectric layer 31 and the second dielectric layer 41 include at least one of epoxy resin, silicone, polyimide, polybenzoxazoles, benzocyclobutene, silicon oxide, phosphor silica glass, fluorine containing glass, and other suitable materials.

As an example, materials of the first wiring metal layer 32 and the second wiring metal layer 42 include at least one of copper, aluminum, and titanium. Techniques of forming the first wiring metal layer 32 and the second wiring metal layer 42 include one of physical vapor deposition, chemical vapor deposition, sputtering, electroplating, and chemical plating. The first wiring metal layer 32 and the second wiring metal layer 42 are single-layer or multiple-layer structures.

Subsequently, the method may include other steps to form different types of wafer-level packaging structures.

As an example, where an RF ASIC wafer-level packaging structure needs to be formed, in a way as shown in FIG. 11, the method for preparing the wafer-level packaging structure may also include the steps described below.

First, soldering an RF ASIC chip 9 to the second rewiring layer 4, with the RF ASIC chip 9 connected to the second wiring metal layer (not illustrated).

Then, forming solder balls 8 on a surface of the first rewiring layer 3, with the solder balls 8 connected to the first wiring metal layer (not shown), thereby forming the RF ASIC wafer-level packaging structure shown in FIG. 11.

As another example, where a fan-out wafer-level packaging structure needs to be formed, as shown in FIG. 13, the method for preparing the wafer-level packaging structure further includes the steps described below.

First, forming metal connection pillars 5 in the molding layer 1, with the metal connection pillars 5 connected to the first wiring metal layer 32 and the second wiring metal layer 42. It is to be noted that the preparation of the metal connection pillars 5 can be carried out simultaneously with the preparation of the 3D IPD structure 2, i.e., while preparing the 3D IPD structure 2 in the molding layer 1, the method includes etching the molding layer 1 and depositing metal material to form the metal connection pillars 5.

Then, soldering chips 6 to the second rewiring layer 42, with the chips 6 connected to the second wiring metal layer 42. Cu—Cu bonding may be used to solder the chips 6.

Finally, forming solder balls 7 on a surface of the first rewiring layer 3 away from the molding layer 1, with the solder balls connected to 7 the first wiring metal layer 32, thereby forming a fan-out wafer-level packaging structure as shown in FIG. 13.

Material of the solder balls 7, 8 include, but are not limited to, copper or nickel. The first wiring metal layer 32 may have solder balls 7, 8 directly formed on its surface, or may have metal pillars (not shown) formed thereon first and then have solder balls 7, 8 formed on the metal pillars.

It should be noted that the methods of the present disclosure can be used to prepare not only the RF ASIC wafer-level packaging structure and fan-out wafer-level packaging structure as described above, but can be also used to prepare any other devices that require the integration of a 3D IPD structure 2.

The method for preparing the wafer-level packaging structure of the present disclosure enables the preparation of higher performance system-based packaging structures by preparing integrated 3D IPD structures in the molding layer. In addition, the wafer-level packaging structures of the present disclosure can integrate various electronic chips and components such as millimeter wave antenna/capacitor/inductor/electric crystal/GPU/PMU/DDR/flash memory/filter, etc., with higher flexibility and wider compatibility, thus reducing package size and package cost.

Therefore, the present disclosure effectively overcomes various shortcomings in the existing technology and has high industrial utilization value.

The above-mentioned embodiments are just used for exemplarily describing the principle and effects of the present disclosure instead of limiting the present disclosure. Those skilled in the art can make modifications or changes to the above-mentioned embodiments without going against the spirit and the range of the present disclosure. Therefore, all equivalent modifications or changes made by those who have common knowledge in the art without departing from the spirit and technical concept disclosed by the present disclosure shall be still covered by the claims of the present disclosure.

What is claimed is:

1. A wafer-level packaging structure, comprising a molding layer, and a 3D IPD (Integrated Passive Devices) structure fabricated in the molding layer, wherein the molding layer includes a first surface and a second surface opposite to the first surface;

wherein the 3D IPD structure comprises one or more of a 3D inductive IPD structure, a 3D capacitive IPD structure, and a 3D resistive IPD structure; and wherein the 3D inductive IPD structure comprises:

first metal solder pads, formed inside the molding layer and extending inwards from the first surface of the molding layer;

metal pillars, formed inside the molding layer and located over ends of the first metal solder pads; and second metal solder pads, formed on the molding layer and extending outwards from the second surface of the molding layer, wherein the second metal solder pads connect the metal pillars in series, with each of the second metal solder pads connecting two of the metal pillars that are respectively located over two adjacent first metal solder pads, and forming the 3D inductive IPD structure.

2. The wafer-level packaging structure according to claim 1, wherein the 3D capacitive IPD structure comprises at least one pair of metal layers formed in the molding layer, wherein the at least one pair of metal layers are spaced apart and parallel to each other, wherein said pair of metal layers are perpendicular to one of the first and second surfaces of the molding layer.

3. The wafer-level packaging structure according to claim 1, further comprising a first rewiring layer formed on the first surface of the molding layer and a second rewiring layer formed on the second surface of the molding layer, wherein the first rewiring layer includes a first dielectric layer and a first wiring metal layer formed in the first dielectric layer, and wherein the second rewiring layer includes a second dielectric layer and a second wiring metal layer formed in the second dielectric layer and connected to the 3D IPD structure.

4. The wafer-level packaging structure according to claim 3, wherein the wafer-level packaging structure is a fan-out wafer-level packaging structure, and further comprises:

metal connection pillars, formed in the molding layer and connected to the first wiring metal layer and the second wiring metal layer;

chips, soldered to the second rewiring layer and connected to the second wiring metal layer; and solder balls, formed on a surface of the first rewiring layer and connected to the first wiring metal layer.

5. The wafer-level packaging structure according to claim 3, wherein the wafer-level packaging structure is an RF ASIC wafer-level packaging structure, and further comprises:

an RF ASIC chip, formed on a surface of the second rewiring layer and connected to the second wiring metal layer; and solder balls, formed on a surface of the first rewiring layer surface and connected to the first wiring metal layer.

6. A method for preparing a wafer-level packaging structure, including:

preparing a molding layer; and forming a 3D IPD (Integrated Passive Devices) structure inside the molding layer, wherein the 3D IPD structure comprises one or more of a 3D inductive IPD structure, a 3D capacitive IPD structure, and a 3D resistive IPD structure;

wherein forming the 3D inductive IPD structure inside the molding layer comprises:

providing a substrate having a release layer, forming first metal solder pads on a surface of the release layer;

forming metal pillars over ends of the first metal solder pads;

forming a molding layer over the release layer to cover the metal pillars and the first metal solder pads, and thinning the molding layer and the metal pillars;

forming second metal solder pads over the molding layer, wherein the second metal solder pads connect the metal pillars in series, with each of the second metal solder pads connecting two of the metal pillars that are respectively located over two adjacent first metal solder pads; and removing the release layer to disengage the substrate, thereby forming the 3D inductive IPD structure.

7. The method according to claim 6, further comprising:

forming a first rewiring layer on a first surface of the molding layer and a second rewiring layer on a second surface of the molding layer, wherein the first rewiring layer includes a first dielectric layer and a first wiring metal layer, wherein the second rewiring layer includes a second dielectric layer and a second wiring metal layer formed in the second dielectric layer and connected to the 3D IPD structure.

8. The method according to claim 7, further comprising:

forming metal connection pillars in the molding layer, wherein the metal connection pillars are connected to the first wiring metal layer and the second wiring metal layer;

soldering chips to the second rewiring layer, wherein the chips are connected to the second wiring metal layer; and forming solder balls on a surface of the first rewiring layer, wherein the solder balls are connected to the first wiring metal layer, thereby forming a fan-out wafer-level packaging structure.

9. The method according to claim 7, further comprising:

soldering an RF ASIC chip to the second rewiring layer, wherein the RF ASIC chip is connected to the second wiring metal layer; and forming a solder ball on a surface of the first rewiring layer, wherein the solder balls are connected to the first wiring metal layer, thereby forming an RF ASIC wafer-level packaging structure.

10. A method for preparing a wafer-level packaging structure, including:

preparing a molding layer; and forming a 3D IPD (Integrated Passive Devices) structure inside the molding layer, wherein the 3D IPD structure comprises one or more of a 3D inductive IPD structure, a 3D capacitive IPD structure, and a 3D resistive IPD structure;

wherein forming the 3D capacitive IPD structure inside the molding layer comprises:

providing a substrate having a release layer, forming a molding layer on a surface of the release layer;

etching the molding layer to form at least one pair of parallel openings exposing the release layer;

filling the openings with metal materials to form at least one pair of metal layers are spaced apart and parallel to each other, wherein said pair of metal layers are perpendicular to one of the first and second surfaces of the molding layer; and removing the release layer to disengage the substrate, thereby forming the 3D capacitive IPD structure.

11. The method according to claim 10, further comprising:

forming a first rewiring layer on a first surface of the molding layer and a second rewiring layer on a second surface of the molding layer, wherein the first rewiring layer includes a first dielectric layer and a first wiring metal layer, wherein the second rewiring layer includes a second dielectric layer and a second wiring metal layer formed in the second dielectric layer and connected to the 3D inductive IPD structure.

12. The method according to claim 11, further comprising:

forming metal connection pillars in the molding layer, wherein the metal connection pillars are connected to the first wiring metal layer and the second wiring metal layer;

soldering chips to the second rewiring layer, wherein the chips are connected to the second wiring metal layer; and forming solder balls on a surface of the first rewiring layer, wherein the solder balls are connected to the first wiring metal layer, thereby forming a fan-out wafer-level packaging structure.

13. The method according to claim 11, further comprising:

soldering an RF ASIC chip to the second rewiring layer, wherein the RF ASIC chip is connected to the second wiring metal layer; and forming a solder ball on a surface of the first rewiring layer, wherein the solder balls are connected to the first wiring metal layer, thereby forming an RF ASIC wafer-level packaging structure.

* * * * *